United States Patent
Yaginuma et al.

(10) Patent No.: US 11,424,157 B2
(45) Date of Patent: Aug. 23, 2022

(54) METHOD OF MANUFACTURING STRUCTURE

(71) Applicant: CANON KABUSHIKI KAISHA, Tokyo (JP)

(72) Inventors: Seiichiro Yaginuma, Kawasaki (JP); Ryotaro Murakami, Yokohama (JP); Hideomi Kumano, Tokyo (JP); Masahisa Watanabe, Yokohama (JP); Tetsushi Ishikawa, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 190 days.

(21) Appl. No.: 16/845,662

(22) Filed: Apr. 10, 2020

(65) Prior Publication Data
US 2020/0335391 A1 Oct. 22, 2020

(30) Foreign Application Priority Data
Apr. 17, 2019 (JP) .............................. JP2019-078793

(51) Int. Cl.
*H01L 21/4763* (2006.01)
*H01L 21/768* (2006.01)
*H01L 21/027* (2006.01)

(52) U.S. Cl.
CPC .... *H01L 21/76817* (2013.01); *H01L 21/0273* (2013.01)

(58) Field of Classification Search
CPC ............ H01L 21/76817; H01L 21/0273; C09J 2203/326
See application file for complete search history.

(56) References Cited

U.S. PATENT DOCUMENTS

| 2019/0217617 A1* | 7/2019 | Otsuka | ..................... B41J 2/164 |
| 2019/0255831 A1* | 8/2019 | Ishikawa | ................. B32B 37/06 |

FOREIGN PATENT DOCUMENTS

JP 2003-145780 A 5/2003

* cited by examiner

*Primary Examiner* — Victor A Mandala
*Assistant Examiner* — Colleen E Snow
(74) *Attorney, Agent, or Firm* — Canon U.S.A., Inc. IP Division

(57) ABSTRACT

A method of manufacturing a structure that includes a substrate provided with a through hole, and a resin layer provided on a front surface of the substrate to close the through hole, includes, in order, preparing the substrate including the through hole and including a support substrate on a back surface of the substrate to close the through hole, bonding a dry film to a front surface of the substrate, the dry film including a support member and a resin layer on the support member, to close the through hole with the resin layer and turn the through hole into a closed space with the substrate, the support substrate, and the dry film, opening the through hole turned into the closed space from the support substrate side, and separating the support member from the dry film while retaining the resin layer on the front surface of the substrate.

12 Claims, 5 Drawing Sheets

METHOD OF MANUFACTURING STRUCTURE

BACKGROUND

Field of the Disclosure

The present disclosure relates to a method of manufacturing a structure that includes a resin layer on a substrate.

Description of the Related Art

As a structure in which a resin layer is provided on a substrate including a through hole, for example, there is a semiconductor substrate is present. Japanese Patent Application Laid-Open No. 2003-145780 discusses a liquid ejection head substrate that is a type of the semiconductor substrate. The liquid ejection head substrate discussed in Japanese Patent Application Laid-Open No. 2003-145780 is manufactured by forming a through hole in the substrate, providing a dry film (photoresist) including a resin layer on a front surface of the substrate so as to close the through hole, and patterning the dry film.

SUMMARY

According to an aspect of the present invention, a method of manufacturing a structure that includes a substrate provided with a through hole, and a resin layer provided on a front surface of the substrate to close the through hole, includes, in order, preparing the substrate including the through hole and including a support substrate on a back surface of the substrate to close the through hole, bonding a dry film to a front surface of the substrate, the dry film including a support member and a resin layer on the support member, to close the through hole with the resin layer and turn the through hole into a closed space with the substrate, the support substrate, and the dry film, opening the through hole turned into the closed space from the support substrate side, and separating the support member from the dry film while retaining the resin layer on the front surface of the substrate.

Further features of the present invention will become apparent from the following description of exemplary embodiments with reference to the attached drawings.

DESCRIPTION OF THE EMBODIMENTS

Figure 1A:
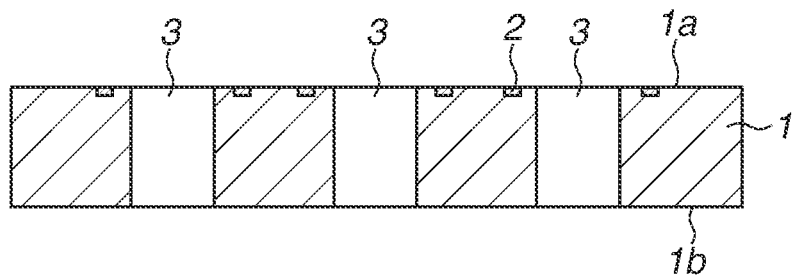
FIGS. 1A, 1B, 1C, 1D, and 1E are diagrams illustrating a method of manufacturing a structure.

In a case where a dry film is provided on a front surface of a substrate, a support substrate is commonly provided on a back surface side of the substrate. If a through hole is provided in the substrate, the through hole is turned into a closed space by the substrate, the support substrate, and the dry film. The present inventors have found an issue that, when the through hole is turned into the closed space, pressure difference occurs between an inside and an outside of the through hole, which causes deformation of a resin layer of the dry film.

Thus, the present invention is directed to a method of manufacturing a structure that can prevent the deformation of the resin layer.

FIGS. 1A, 1B, 1C, 1D, and 1E are diagrams illustrating an example of a method of manufacturing a substrate according to an exemplary embodiment, and each illustrate a cross-section of the substrate in each step. A through hole 3 is provided in a substrate 1 illustrated in FIG. 1A. The substrate 1 includes a front surface 1a and a back surface 1b that is a surface on a side opposite to the front surface 1a. The through hole 3 is a hole that passes through the substrate 1 from the front surface 1a to the back surface 1b. An example of the substrate 1 is a silicon substrate containing silicon. An element 2 is provided on the substrate 1 on the front surface 1a side thereof. Examples of the element 2 include an electronic component, a microelectronic mechanical system (MEMS), a sensor, a functional film, and an energy generating device (e.g., heat generating resistor, piezoelectric element). The element 2 may be provided on the back surface 1b side of the substrate 1. Further, the element 2 may be provided on the front surface 1a (or back surface 1b) of the substrate 1 or may be embedded in the front surface 1a (or back surface 1b).

Figure 1B:
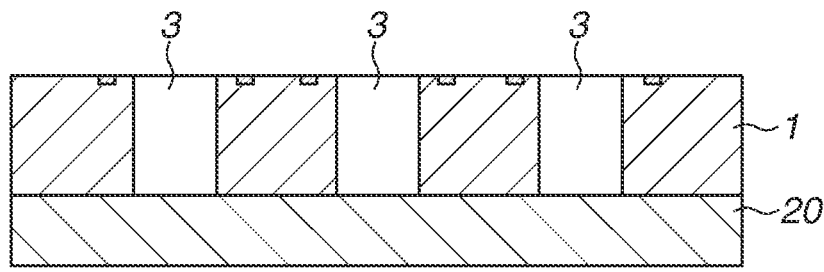

FIG. 1B illustrates a state where a support substrate 20 is provided on the back surface 1b of the substrate 1 so as to close the through hole 3. A film-like or plate-like member can be used as the support substrate 20. Examples of a material for forming the support substrate 20 include glass, metal, silicon, plastic, wax, a photosensitive material such as a photoresist, a self-adhesive material adhering without an adhesive, and an adhesive tape adhering by an adhesive layer. The support substrate 20 may include a plurality of members that are layered or may include a structure. The support substrate 20 may include, for example, a sacrificial layer removable with a remover to facilitate reuse or an electroconductive structure to suppress charging. In addition, the support substrate 20 may include a member softer than the substrate 1 in order to protect the substrate 1. The support substrate 20 desirably contains a material allowing visible light to pass therethrough so that a state of an interface between the substrate 1 and the support substrate 20 can be easily checked. Further, in terms of ease of separation in a subsequent step, the support substrate 20 including a self-adhesive material or an adhesive tape is desirably used. In the present exemplary embodiment, steps are desirably performed in a described order.

The support substrate 20 is bonded to the back surface 1b of the substrate 1 using an adhesive or wax as necessary. Alternatively, the support substrate 20 may be bonded to the back surface 1b of the substrate 1 by bonding using static electricity, decompression, heat, or ultrasonic, or by surface activated bonding using plasma or an ion beam. Alternatively, the substrate 1 may be fitted into the support substrate 20, or the substrate 1 may hold the support substrate 20 with use of friction between the support substrate 20 and the substrate 1. In terms of the ease of separation in a subsequent step, the support substrate 20 is desirably bonded to the substrate 1 by electrostatic welding.

Figure 1C:
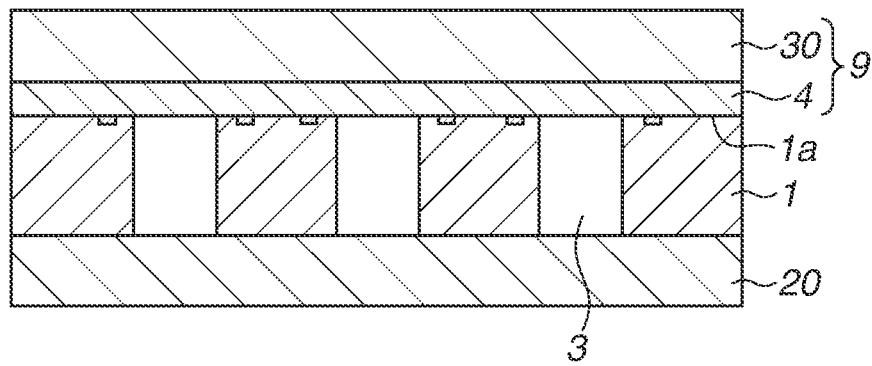

After the substrate 1 is prepared in the above-described manner, a dry film 9 that includes a support member 30 and a resin layer 4 formed on the support member 30 is bonded to the front surface 1a of the substrate 1 so that the resin layer 4 closes the through hole 3, as illustrated in FIG. 1C.

As a result, the through hole 3 is turned into a closed space surrounded by the substrate 1, the support substrate 20, and the dry film 9. The closed space referred to herein indicates a space in which a pressure difference between an inside and an outside of the closed space is maintained in a timescale until the processing proceeds to the next step in a common lamination method. In the timescale, the space is regarded as the closed space even if there is leakage at a level that allows the closed space to be maintained. The timescale until the processing proceeds to the next step is, for example, several ten seconds to several minutes (i.e., 10 seconds or more and 300 seconds or less) for a series of processes performed by the same lamination apparatus. In a case where the apparatus is changed, the timescale is several ten minutes to several hours (i.e., 10 minutes or more and 300 minutes or less).

In the dry film 9, the resin layer 4 is supported by the support member 30 to prevent deformation of the resin layer 4 due to the pressure difference between the inside and the outside of the closed space. To prevent the deformation of the resin layer 4, a softening point of the support member 30 is preferably higher than a softening point of the resin layer 4. A difference between the softening points is preferably 5° C. or more to easily achieve the difference in consideration of temperature distribution within a substrate surface, more preferably 10° C. or more, and still more preferably 20° C. or more.

The resin layer 4 on the support member 30 preferably contains a photosensitive resin. The support member 30 desirably contains at least any of glass, metal, silicon, and plastic.

When the dry film 9 is bonded to the front surface 1a of the substrate 1, the resin layer 4 is desirably heated to the softening point or above of the resin layer 4 in order to enhance adhesiveness between the dry film 9 and the substrate 1. Further, to prevent formation of a gap between the front surface 1a of the substrate 1 and the resin layer 4 due to a level difference portion present on the front surface 1a of the substrate 1, the dry film 9 is desirably bonded under reduced pressure. However, if the substrate 1, which includes the through hole 3 turned into the closed space, is placed under an atmospheric pressure again to increase the applied pressure while the temperature thereof is increased by heating, the resin layer 4 is easily deformed by the pressure difference between the inside and the outside of the closed space. Thus, the bonding of the dry film 9 is performed under reduced pressure, the temperature of the resin layer 4 is reduced to suppress fluidity of the resin layer 4, and then the substrate 1 is placed under the atmospheric pressure again to increase the applied pressure. This easily prevents the deformation of the resin layer 4. In decreasing the temperature, an amount of temperature decrease is preferably 5° C. or more to easily achieve the difference in consideration of the temperature distribution within the substrate surface, more preferably 10° C. or more, and still more preferably 20° C. or more. The temperature is preferably decreased to the softening point or below of the resin layer 4. A structure to improve heat conduction efficiency may be provided to each of the substrate 1, the support member 30, and the support substrate 20.

The dry film 9 may be bonded to the front surface 1a of the substrate 1 through heating from both of the support member 30 side and the support substrate 20 side. In this case, the temperature on the support member 30 side is made higher than the temperature on the support substrate 20 side, and a heating body on the support member 30 side is separated after the bonding. This makes it possible to easily lower the temperature of the resin layer 4. In this case, preferably, the temperature of the support substrate 20 is lower by 5° C. or more than the temperature of the support member 30, or the temperature of the support substrate 20 is lower than the softening temperature of the resin layer 4. Alternatively, the temperature of the resin layer 4 is preferably higher than the softening temperature of the resin layer 4, and the temperature of the support substrate 20 is preferably lower than the softening temperature of the resin layer 4. In this case, the temperature distribution may have an inclination from the support member 30 toward the support substrate 20. The temperature on the support substrate 20 side can be relatively lowered, whereby a higher effect of thermal stress suppression can be achieved.

The dry film 9 may be bonded to the front surface 1a of the substrate 1 through partial heating of the resin layer 4 or a layered body of the substrate 1 and the support substrate 20. The partial heating refers to a partial change in the temperature within the surface of the substrate 1. For example, methods may be used such as a method of bringing a substrate into partial contact with the heating body, a method of applying electromagnetic waves, laser, electronic beams, or plasma, a method of heating by electromagnetic induction, or a method in which wiring is prepared on the support substrate 20 or the like to partially heat the substrate through resistance heating. The heating may be performed by a pulse method using a flash lamp or a pulse laser.

The dry film 9 and the support substrate 20 may be respectively bonded to the front surface 1a and the back surface 1b of the substrate 1 at a time. This enables the steps illustrated in FIGS. 1A to 1C to be performed at a time, which makes it possible to achieve an effect in reducing the number of steps.

In a case where the resin layer 4 contains a photosensitive resin, the resin layer 4 may be exposed through the support member 30 after the bonding of the dry film 9 and before separation of the support substrate 20. As a result, the resin layer 4 is cured and the deformation of the resin layer 4 due to the pressure difference between the inside and the outside of the closed space is easily prevented, in particular in a case where the resin layer 4 contains a negative photosensitive resin.

The deformation of the resin layer 4 of the dry film 9 can be prevented if the support substrate 20 side is deformed due to the pressure difference. Thus, it is preferable that the support substrate 20 be more easily deformed than the dry film 9.

Figure 1D:
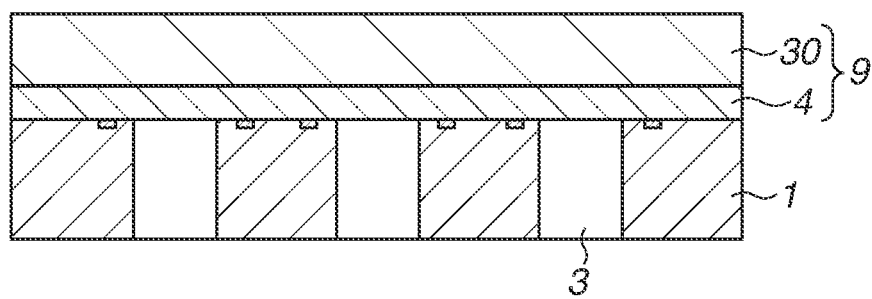

After the through hole 3 is turned into the closed space, the support substrate 20 is removed (separated) from the support substrate 20 side of the substrate 1 to open the through hole 3 turned into the closed space as illustrated in FIG. 1D. The through hole 3 can be opened by removing part of the support substrate 20. In other words, instead of removal of the whole support substrate 20, the support substrate 20 may be perforated, and part of the support substrate 20 may be removed, so that the inside of the through hole 3 can communicate with the outside thereof through the perforated part.

Alternatively, after the through hole 3 turned into the closed space is opened, the support substrate 20 may be reused and be bonded to the substrate 1. In a case where the dry film 9 is bonded under the reduced pressure, the deformation of the resin layer 4 can be prevented by opening the through hole 3 turned into the closed space before the applied pressure is increased.

A case where the support substrate 20 is processed to be reused as a structure is described. In the case where the support substrate 20 is reused as the structure, the support substrate 20 is processed by, for example, lithography, wet etching, dry etching, laser processing, electronic beam processing, ion beam processing, sandblasting, or cutting. The photosensitive resin is desirably used as the support substrate 20 and is desirably processed by lithography, whereby the structure with high accuracy can be obtained. In a case where the processed support substrate 20 is bonded to the substrate 1, a bonding method using an adhesive may be used. Alternatively, a bonding method using chemical bonding or a bonding method using a resin that is cured by heat or light is desirably used from a viewpoint of reliability.

Figure 1E:
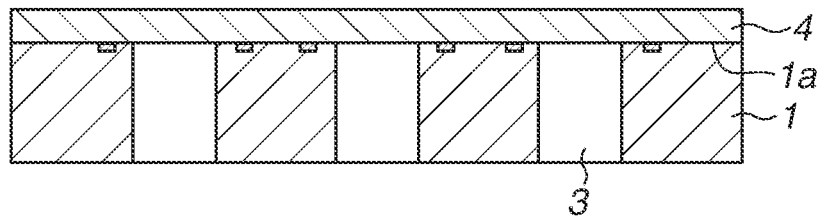

Next, as illustrated in FIG. 1E, the support member 30 is separated from the dry film 9 while the resin layer 4 is retained on the front surface 1a of the substrate 1. The deformation of the resin layer 4 can be prevented by separating the support member 30 after the through hole 3 turned into the closed space is opened. The support member 30 is desirably separated by, for example, wet etching or dry etching, or physical processing such as grinding and polishing, laser processing, waterjet processing, and sandblasting. To physically remove the support member 30, the support member 30 desirably has flexibility.

If the support member 30 is separated without opening the through hole 3 turned into the closed space, the deformation of the resin layer 4 may become large in particular when the temperature of the substrate 1 is higher than or equal to room temperature (25° C.). Thus, in the case where the support member 30 is separated at a temperature higher than or equal to the room temperature, a higher effect of preventing the deformation of the resin layer 4 can be obtained.

Figure 2A:
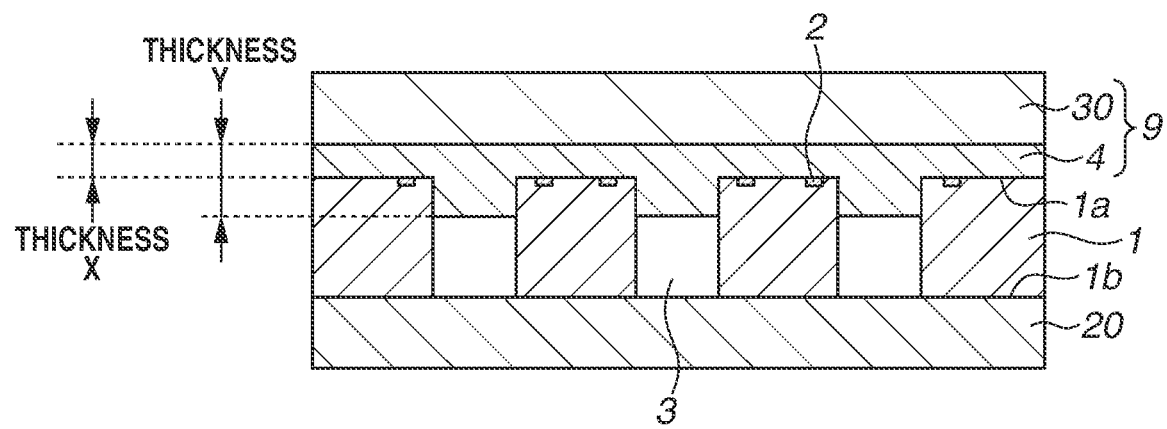
FIGS. 2A and 2B are diagrams each illustrating the structure in a manufacturing process.
Figure 2B:
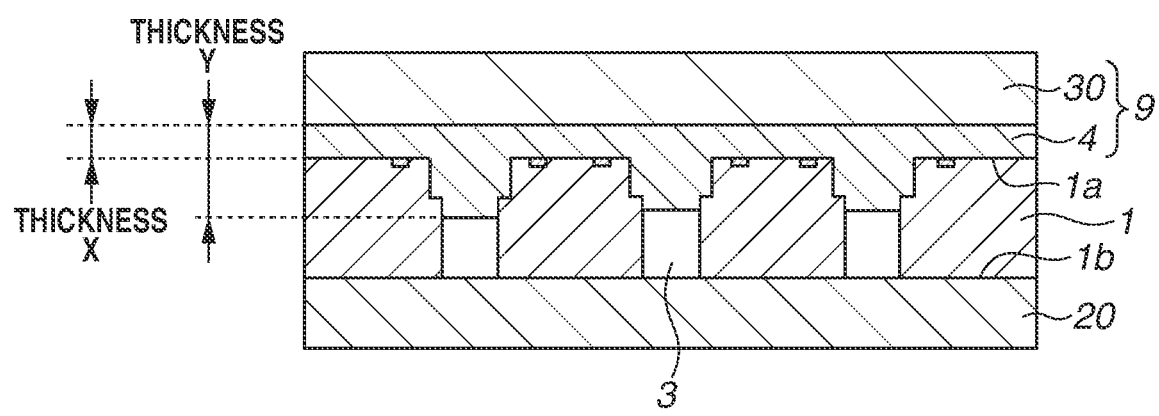

FIGS. 2A and 2B illustrate the structure in a step similar to the step in FIG. 1C, in the manufacturing process. In FIG. 2A, part of the resin layer 4 is entered into the through hole 3 by bonding of the dry film 9. This makes it possible to increase a thickness of the resin layer 4 in a part corresponding to the through hole 3 and to further prevent the deformation of the resin layer 4. When a thickness X of the resin layer 4 on the front surface 1a of the substrate 1 is compared with a thickness Y of the resin layer 4 in the part corresponding to the through hole 3, the thickness Y is preferably larger than or equal to 1.2 times of the thickness X, more preferably larger than or equal to 1.5 times of the thickness X, and still more preferably larger than or equal to 2.0 times of the thickness X. Furthermore, the thickness Y is preferably smaller than or equal to 5.0 times of the thickness X.

FIG. 2B illustrates a shape in which a cross-sectional area of the through hole 3 in a direction parallel to the front surface 1a changes from the front surface 1a toward the back surface 1b of the substrate 1. Such a configuration is preferable because the resin layer 4 is hardly deformed.

FIGS. 3A, 3B, 3C, and 3D illustrate an exemplary embodiment different from the exemplary embodiment described with reference to FIGS. 1A, 1B, 1C, 1D, and 1E.

Figure 3A:
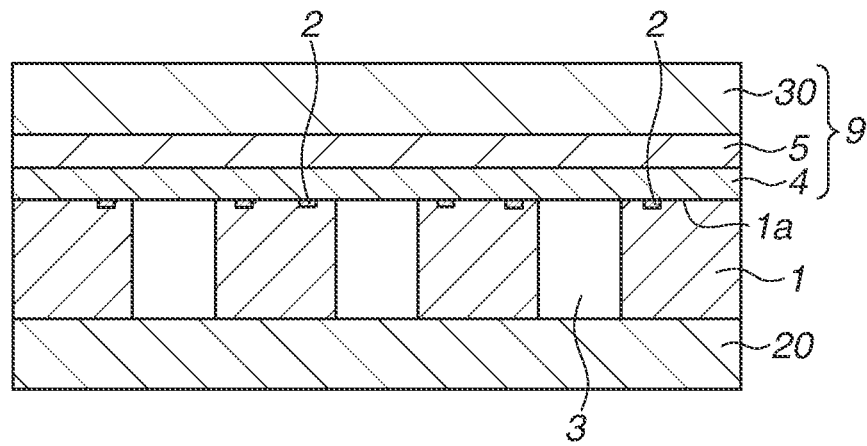
FIGS. 3A, 3B, 3C and 3D are diagrams illustrating a method of manufacturing a structure.

In FIG. 3A, the multilayer dry film 9 in which the resin layer 4 and a resin layer 5 are provided on the support member 30 is bonded to the substrate 1. As the resin layer 4 coming into contact with the front surface 1a of the substrate 1, a material having a softening point allowing for easy deformation is desirably used to ensure adhesiveness with the substrate 1 and to prevent the formation of a gap. Thus, a softening point of the resin layer 5 is set higher than the softening point of the resin layer 4 to achieve resistance to deformation as the multilayer dry film, to ensure adhesiveness with the substrate 1, and to prevent the formation of a gap. Each of the resin layer 4 and the resin layer 5 may contain, for example, a photosensitive resin. In this case, the resin layer 4 and the resin layer 5 desirably have differences in sensitivity to light, a photosensitive wavelength, and absorbance. In addition, each of the resin layer 4 and the resin layer 5 may contain a thermosetting resin. In this case, the resin layer 4 and the resin layer 5 desirably have difference in sensitivity to heat.

Figure 3B:
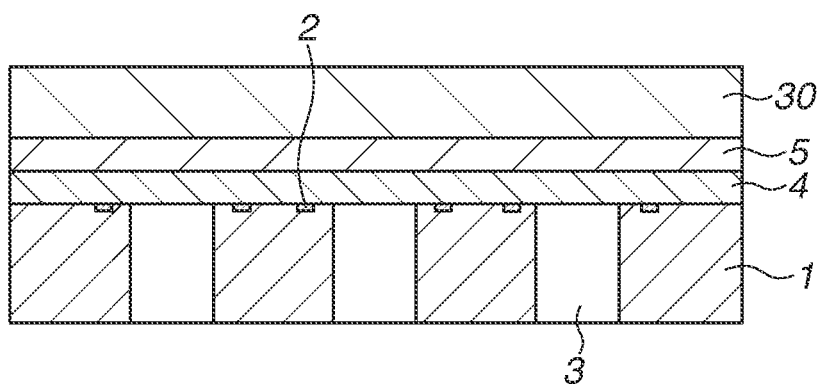

FIG. 3B is a diagram illustrating a state where the support substrate 20 is separated from the substrate 1 from the support substrate 20 side to open the through hole 3 turned into the closed space.

Figure 3C:
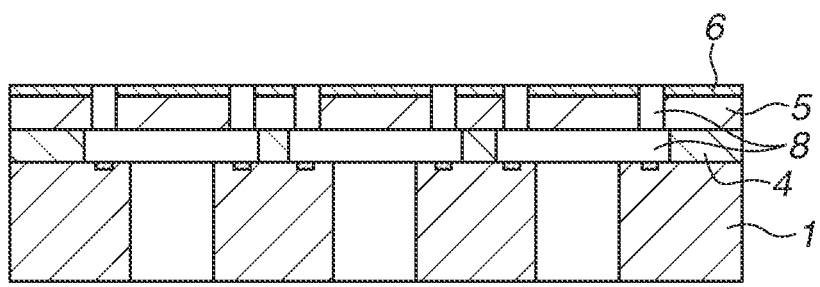

FIG. 3C is a diagram illustrating a state where the support member 30 is separated from the dry film 9 while the resin layer 4 and the resin layer 5 are retained on the front surface 1a of the substrate 1, and the resin layer 4 and the resin layer 5 are further processed to form a flow path 8. In addition, a water-repellent layer 6 is provided on the resin layer 5.

Figure 3D:
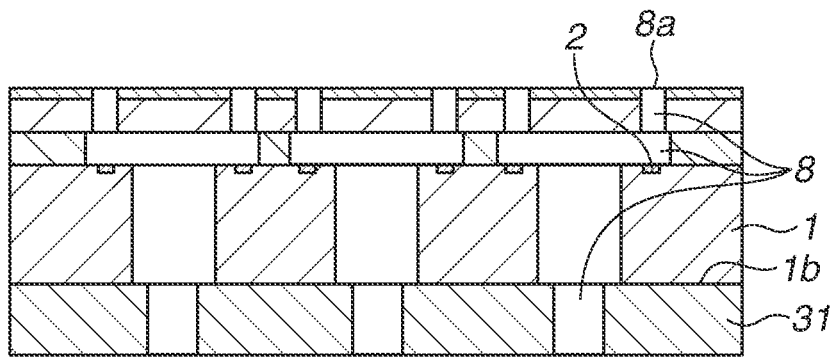

FIG. 3D is a diagram illustrating a state where a flow-path forming member 31 is provided on the back surface 1b of the substrate 1. The flow-path forming member 31 also forms the flow path 8. The liquid ejection head substrate can be formed by the structure in the above-described manner A liquid ejection port 8a is provided on an upper part of the flow path 8. The element 2 is an energy generating element. The element 2 provides energy to the liquid, and the liquid is ejected from the ejection port 8a.

Figure 4A:
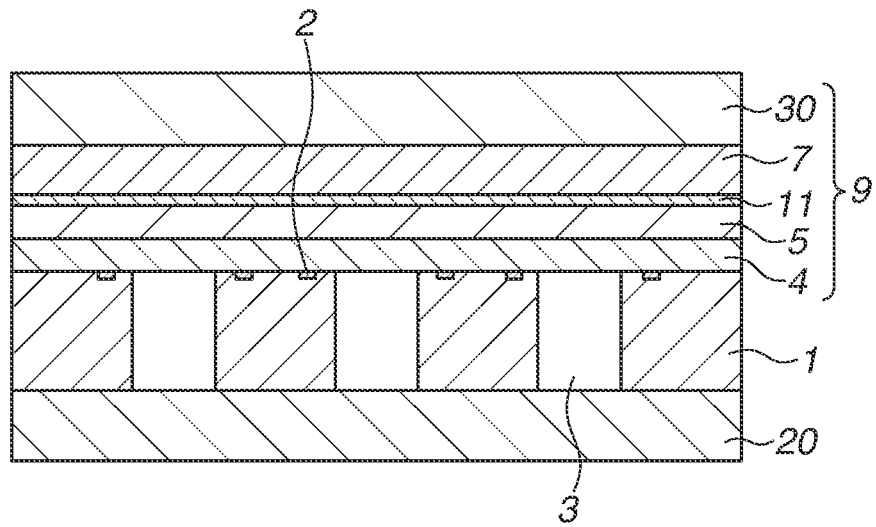
FIGS. 4A, 4B, and 4C are diagrams illustrating a method of manufacturing a structure.
Figure 4B:
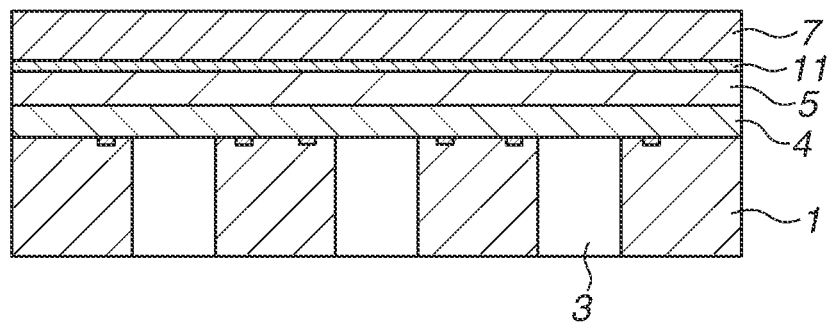
Figure 4C:
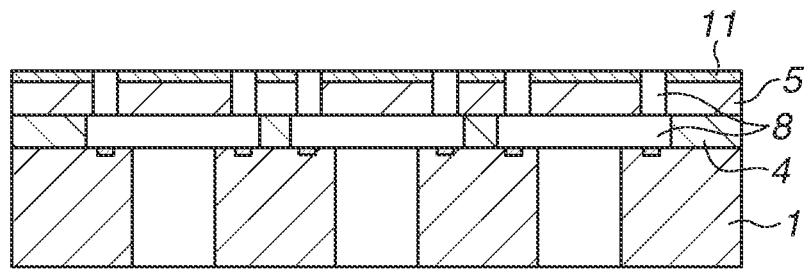

FIGS. 4A, 4B, and 4C illustrate an exemplary embodiment further different from the exemplary embodiment described with reference to FIGS. 1A, 1B, 1C, 1D, and 1E. In FIG. 4A, the multilayer dry film 9 in which the resin layer 4, the resin layer 5, a resin layer 11, and a resin layer 7 are provided on the support member 30 is bonded to the substrate 1. Each of the resin layer 4, the resin layer 5, and the resin layer 11 contains a photosensitive resin, whereas the resin layer 7 contains a non-photosensitive resin not having photosensitivity. The resin cured by exposure and heating is referred to as the photosensitive resin, whereas the resin not cured by exposure and heating is referred to as the non-photosensitive resin.

FIG. 4B is a diagram illustrating a state where the support substrate 20 is separated from the substrate 1 from the support substrate 20 side to open the through hole 3 turned into the closed space, and the support member 30 is also separated from the resin layer 7.

FIG. 4C is a diagram illustrating a state where the resin layer 7 containing the non-photosensitive resin is removed, and the resin layer 4, the resin layer 5, and the resin layer 11 are processed to form the flow path 8. In the present exemplary embodiment, the use of the resin layer 7 increases the thickness of the resin layer in the dry film 9 as a whole. Then, the resin layer 7 is eventually removed. As a result, the deformation of the resin layer 4 can be further prevented by the resin layer 7.

Figure 5A:
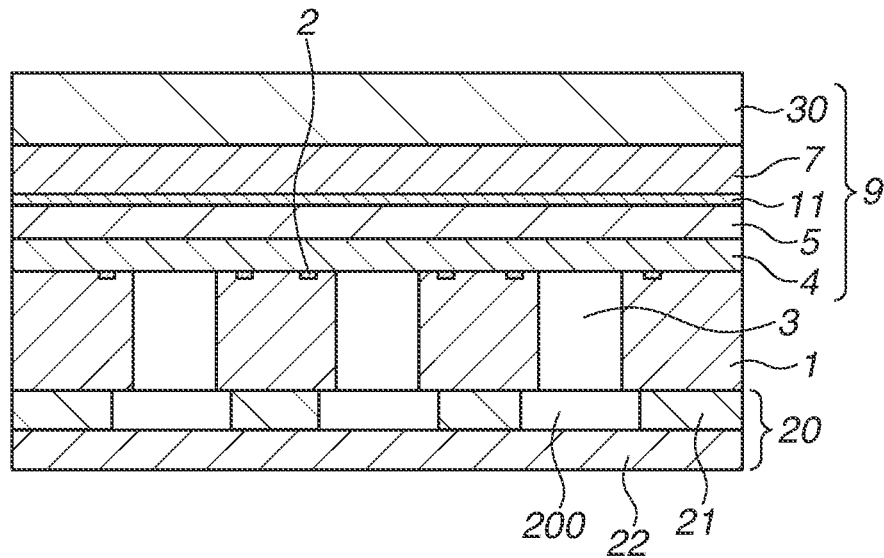
FIGS. 5A, 5B, and 5C are diagrams illustrating a method of manufacturing a structure.
Figure 5B:
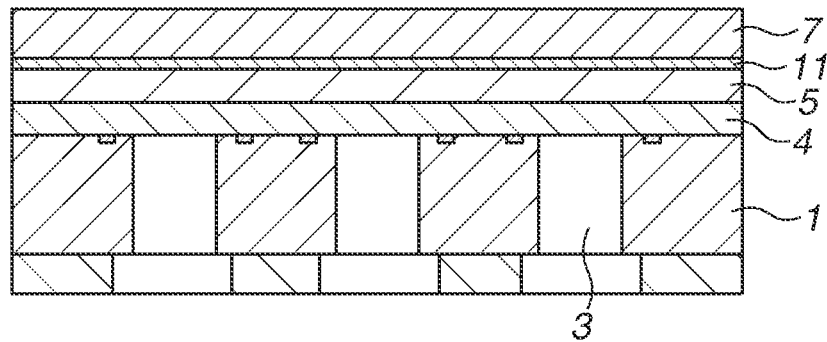
Figure 5C:
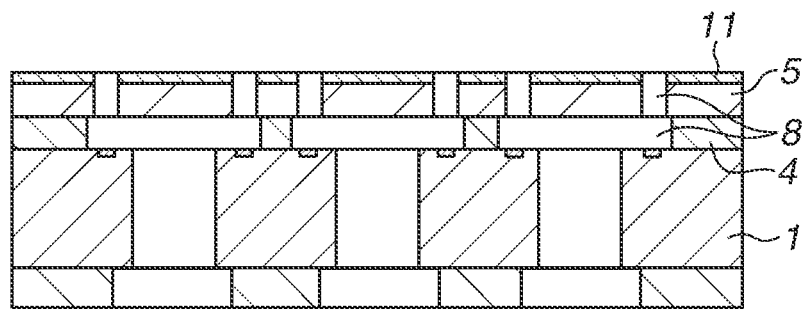

FIGS. 5A, 5B, and 5C illustrate an exemplary embodiment further different from the exemplary embodiment described in FIGS. 1A, 1B, 1C, 1D, and 1E. In FIG. 5A, the support substrate 20 has a layered structure unlike the support substrate 20 illustrated in FIG. 4A. More specifically, the support substrate 20 includes a first support substrate 21 and a second support substrate 22. The first support substrate 21 includes a hole 200. At this time, the hole 200 communicates with the through hole 3, and is turned into a closed space together with the through hole 3. When the support substrate 20 has the layered structure as described above, the support substrate 20 can be processed before the substrate 1 and the support substrate 20 are bonded together. As compared with the case where the support substrate 20 is processed after the substrate 1 and the support substrate 20 are bonded together, the support substrate 20 is easily processed.

FIG. 5B is a diagram illustrating a state where the second support substrate 22 is separated from the first support substrate 21 to open the through hole 3 turned into the closed space, and the support member 30 is also separated from the resin layer 7. The first support substrate 21 is retained on the substrate 1 as the structure.

FIG. 5C is a diagram illustrating a state where the resin layer 7 is removed, and the resin layer 4, the resin layer 5, and the resin layer 11 are processed to form the flow path 8.

The structure can also be manufactured in the above-described manner.

The exemplary embodiments of the present invention are applicable to the structure that includes the substrate provided with the through hole and the resin layer provided on the surface of the substrate so as to close the through hole. Examples of the structure include a liquid ejection head substrate, a semiconductor substrate, a MEMS substrate, and a printed substrate. Among them, the method is effective for the process of manufacturing the liquid ejection head substrate in which the liquid flow path is formed with the photosensitive resin on the substrate having a through hole.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-078793, filed Apr. 17, 2019, which is hereby incorporated by reference herein in its entirety.

What is claimed is:

1. A method of manufacturing a structure that includes a substrate provided with a through hole, and a resin layer provided on a front surface of the substrate to close the through hole, the method comprising, in order:
preparing the substrate including the through hole and including a support substrate on a back surface of the substrate to close the through hole;
bonding a dry film to a front surface of the substrate, the dry film including a support member and a resin layer on the support member, to close the through hole with the resin layer and turn the through hole into a closed space with the substrate, the support substrate, and the dry film;
opening the through hole turned into the closed space from the support substrate side; and
separating the support member from the dry film while retaining the resin layer on the front surface of the substrate,
wherein the support substrate is bonded to the substrate by electrostatic welding.

2. The method of manufacturing the structure according to claim 1, wherein the support substrate includes a self-adhesive material or an adhesive tape.

3. The method of manufacturing the structure according to claim 1, wherein the support member has a softening point higher than a softening point of the resin layer.

4. The method of manufacturing the structure according to claim 1, wherein the resin layer contains a photosensitive resin.

5. The method of manufacturing the structure according to claim 1, wherein the dry film is bonded to the front surface of the substrate under reduced pressure.

6. The method of manufacturing the structure according to claim 1, wherein the support substrate is more easily deformed than the dry film.

7. The method of manufacturing the structure according to claim 1, wherein the through hole turned into the closed space is opened from the support substrate side by removing the support substrate from the substrate.

8. The method of manufacturing the structure according to claim 1, wherein the dry film is bonded to the front surface of the substrate so that part of the resin layer is entered into the through hole.

9. The method of manufacturing the structure according to claim 1, wherein the resin layer includes two resin layers.

10. A method of manufacturing a structure that includes a substrate provided with a through hole, and a resin layer provided on a front surface of the substrate to close the through hole, the method comprising, in order:
preparing the substrate including the through hole and including a support substrate on a back surface of the substrate to close the through hole;
bonding a dry film to a front surface of the substrate, the dry film including a support member and a resin layer on the support member, to close the through hole with the resin layer and turn the through hole into a closed space with the substrate, the support substrate, and the dry film;
opening the through hole turned into the closed space from the support substrate side; and
separating the support member from the dry film while retaining the resin layer on the front surface of the substrate,
wherein the through hole turned into the closed space is opened from the support substrate side by perforating the support substrate and removing part of the support substrate.

11. A method of manufacturing a structure structure that includes a substrate provided with a through hole, and a resin layer provided on a front surface of the substrate to close the through hole, the method comprising, in order:
preparing the substrate including the through hole and including a support substrate on a back surface of the substrate to close the through hole;
bonding a dry film to a front surface of the substrate, the dry film including a support member and a resin layer on the support member, to close the through hole with the resin layer and turn the through hole into a closed space with the substrate, the support substrate, and the dry film;
opening the through hole turned into the closed space from the support substrate side; and
separating the support member from the dry film while retaining the resin layer on the front surface of the substrate,
wherein the through hole has a shape in which a cross-sectional area of the through hole in a direction parallel to the front surface of the substrate changes from the front surface toward the back surface of the substrate.

12. A method of manufacturing a structure that includes a substrate provided with a through hole, and a resin layer provided on a front surface of the substrate to close the through hole, the method comprising, in order:
preparing the substrate including the through hole and including a support substrate on a back surface of the substrate to close the through hole;
bonding a dry film to a front surface of the substrate, the dry film including a support member and a resin layer on the support member, to close the through hole with the resin layer and turn the through hole into a closed space with the substrate, the support substrate, and the dry film;

opening the through hole turned into the closed space from the support substrate side; and separating the support member from the dry film while retaining the resin layer on the front surface of the substrate, wherein the resin layer includes two resin layers, and wherein the two resin layers are a resin layer containing a photosensitive resin and a resin layer containing a non-photosensitive resin.

* * * * *